(12) United States Patent
Bondokov et al.

(10) Patent No.: US 8,349,077 B2
(45) Date of Patent: Jan. 8, 2013

(54) LARGE ALUMINUM NITRIDE CRYSTALS WITH REDUCED DEFECTS AND METHODS OF MAKING THEM

(75) Inventors: Robert T. Bondokov, Watervliet, NY (US); Kenneth Morgan, Castleton, NY (US); Glen A. Slack, Scotia, NY (US); Leo J. Schowalter, Latham, NY (US)

(73) Assignee: Crystal IS, Inc., Green Island, NY (US)

( * ) Notice: Subject to any disclaimer, the term of this patent is extended or adjusted under 35 U.S.C. 154(b) by 956 days.

(21) Appl. No.: 11/605,192

(22) Filed: Nov. 28, 2006

(65) Prior Publication Data

US 2007/0134827 A1 Jun. 14, 2007

Related U.S. Application Data

(60) Provisional application No. 60/740,082, filed on Nov. 28, 2005.

(51) Int. Cl.
*C30B 23/00* (2006.01)

(52) U.S. Cl. ............... 117/97; 117/84; 117/88; 117/100; 117/101; 117/109; 117/952

(58) Field of Classification Search ............ 117/84, 117/88, 97, 100, 101, 109, 952
See application file for complete search history.

(56) References Cited

U.S. PATENT DOCUMENTS

| | | | |
|---|---|---|---|
| 3,531,245 A | 9/1970 | Dietz | |
| 3,600,701 A | 8/1971 | Gouldthorpe | |
| 3,603,414 A | 9/1971 | Stebley | |
| 3,607,014 A | 9/1971 | Huml et al. | |
| 3,634,149 A | 1/1972 | Knippenberg et al. | |
| 3,768,983 A | 10/1973 | Elkins et al. | |
| 3,903,357 A | 9/1975 | Woolfson et al. | |
| 3,933,573 A | 1/1976 | Dugger | |
| 4,008,851 A | 2/1977 | Hirsch | |
| 4,088,515 A | 5/1978 | Blakeslee et al. | |
| 4,234,554 A | 11/1980 | Rabenau et al. | |
| 4,547,471 A | 10/1985 | Huseby et al. | |
| 5,292,487 A | 3/1994 | Tatsumi et al. | |
| 5,494,861 A | 2/1996 | Yamaga et al. | |
| 5,520,785 A | 5/1996 | Evans et al. | |

(Continued)

FOREIGN PATENT DOCUMENTS

DE 102 48 954 A1 4/2004

(Continued)

OTHER PUBLICATIONS

Rojo et al., "Progress in the preparation of aluminum nitride substrates from bulk crystals," *Mat. Res. Soc. Sym. Proc.*, vol. 722 (2002), pp. 5-13.

(Continued)

*Primary Examiner* — Matthew Song
(74) *Attorney, Agent, or Firm* — Bingham McCutchen LLP

(57) ABSTRACT

Reducing the microvoid (MV) density in AlN ameliorates numerous problems related to cracking during crystal growth, etch pit generation during the polishing, reduction of the optical transparency in an AlN wafer, and, possibly, growth pit formation during epitaxial growth of AlN and/or AlGaN. This facilitates practical crystal production strategies and the formation of large, bulk AlN crystals with low defect densities—e.g., a dislocation density below $10^4$ cm$^{-2}$ and an inclusion density below $10^4$ cm$^{-3}$ and/or a MV density below $10^4$ cm$^{-3}$.

23 Claims, 4 Drawing Sheets

U.S. PATENT DOCUMENTS

| | | | |
|---|---|---|---|
| 5,858,085 A | 1/1999 | Arai et al. | |
| 5,858,086 A | 1/1999 | Hunter | |
| 5,868,837 A | 2/1999 | DiSalvo et al. | |
| 5,909,036 A * | 6/1999 | Tanaka et al. | 257/94 |
| 5,924,874 A | 7/1999 | Gotoh et al. | |
| 5,954,874 A | 9/1999 | Hunter | |
| 5,972,109 A | 10/1999 | Hunter | |
| 5,981,980 A | 11/1999 | Miyajima et al. | |
| 6,000,174 A | 12/1999 | Yamazaki et al. | |
| 6,001,748 A | 12/1999 | Tanaka et al. | |
| 6,006,620 A | 12/1999 | Lawrie et al. | |
| 6,045,612 A | 4/2000 | Hunter | |
| 6,048,813 A | 4/2000 | Hunter | |
| 6,063,185 A | 5/2000 | Hunter | |
| 6,066,205 A | 5/2000 | Hunter | |
| 6,086,672 A | 7/2000 | Hunter | |
| 6,187,089 B1 | 2/2001 | Phillips et al. | |
| 6,211,089 B1 | 4/2001 | Kim et al. | |
| 6,270,569 B1 | 8/2001 | Shibata et al. | |
| 6,296,956 B1 * | 10/2001 | Hunter | 428/698 |
| 6,398,867 B1 | 6/2002 | D'Evelyn et al. | |
| 6,404,125 B1 | 6/2002 | Garbuzov et al. | |
| 6,447,604 B1 | 9/2002 | Flynn et al. | |
| 6,468,347 B1 | 10/2002 | Motoki et al. | |
| 6,515,308 B1 | 2/2003 | Kneissl et al. | |
| 6,592,663 B1 | 7/2003 | Sarayama et al. | |
| 6,596,079 B1 | 7/2003 | Vaudo et al. | |
| 6,719,843 B2 | 4/2004 | Schowalter | |
| 6,770,135 B2 | 8/2004 | Schowalter | |
| 6,936,357 B2 | 8/2005 | Melnik et al. | |
| 7,037,838 B2 | 5/2006 | Schowalter | |
| 7,056,383 B2 | 6/2006 | Helava et al. | |
| 7,063,741 B2 | 6/2006 | D'Evelyn et al. | |
| 7,211,146 B2 | 5/2007 | Schowalter | |
| 7,288,152 B2 | 10/2007 | Kitaoka et al. | |
| 2001/0051433 A1 | 12/2001 | Francis et al. | |
| 2002/0170490 A1 * | 11/2002 | Vodakov et al. | 117/106 |
| 2003/0047816 A1 | 3/2003 | Dutta | |
| 2003/0168003 A1 * | 9/2003 | Schowalter et al. | 117/106 |
| 2003/0216011 A1 | 11/2003 | Nakamura et al. | |
| 2004/0033690 A1 * | 2/2004 | Schowalter et al. | 438/689 |
| 2004/0187766 A1 | 9/2004 | Letertre | |
| 2004/0206978 A1 | 10/2004 | Saxler | |
| 2004/0213309 A9 | 10/2004 | Amano et al. | |
| 2004/0224484 A1 | 11/2004 | Fareed et al. | |
| 2004/0226917 A1 | 11/2004 | Laconto et al. | |
| 2004/0245535 A1 | 12/2004 | D'Evelyn et al. | |
| 2005/0062392 A1 | 3/2005 | Sakai et al. | |
| 2005/0072986 A1 | 4/2005 | Sasaoka | |
| 2005/0103257 A1 | 5/2005 | Xu et al. | |
| 2005/0142391 A1 | 6/2005 | Dmitriev et al. | |
| 2005/0161697 A1 | 7/2005 | Nakahata et al. | |
| 2005/0214992 A1 | 9/2005 | Chakraborty et al. | |
| 2005/0269577 A1 | 12/2005 | Ueda et al. | |
| 2005/0285141 A1 | 12/2005 | Piner et al. | |
| 2006/0029832 A1 | 2/2006 | Xu et al. | |
| 2006/0054075 A1 | 3/2006 | Dwilinski et al. | |
| 2006/0244011 A1 | 11/2006 | Saxler | |
| 2006/0255341 A1 | 11/2006 | Pinnington et al. | |
| 2006/0281205 A1 | 12/2006 | Park | |
| 2006/0288929 A1 | 12/2006 | Slack | |
| 2007/0101932 A1 | 5/2007 | Schowalter et al. | |
| 2007/0131160 A1 | 6/2007 | Slack et al. | |
| 2007/0257333 A1 | 11/2007 | Schlesser et al. | |

FOREIGN PATENT DOCUMENTS

| | | |
|---|---|---|
| EP | 0 609 799 A2 | 8/1994 |
| EP | 0 811 708 | 12/1997 |
| EP | 0 979 883 | 2/2000 |
| EP | 1 211 715 | 6/2002 |
| EP | 1 732 145 A2 | 12/2006 |
| EP | 1 754 810 A1 | 2/2007 |
| JP | 61-236686 | 10/1986 |
| JP | 02-018379 A | 1/1990 |
| JP | 03-285075 | 12/1991 |
| JP | 2000-154090 | 6/2000 |
| JP | 2001-192647 | 7/2001 |
| WO | WO-00-22203 | 4/2000 |
| WO | WO-03-007383 | 1/2003 |
| WO | WO-03-081730 A2 | 10/2003 |
| WO | WO-2005-012602 A1 | 2/2005 |
| WO | WO-2006-110512 A1 | 10/2006 |
| WO | WO-2007-062250 A2 | 5/2007 |
| WO | WO-2008-042020 A2 | 4/2008 |

OTHER PUBLICATIONS

Slack et al., "Growth of High Purity AlN Crystals," *Journal of Crystal Growth*, vol. 34 (1976), pp. 263-279.

Slack et al., "Properties of Crucible Materials for Bulk Growth of AlN," *Mat. Res. Soc. Symp. Proc.*, vol. 798 (2004), pp. Y10.74.1-Y10.74.4.

Slack et al., "Some effects of oxygen impurities on AlN and GaN," *Journal of Crystal Growth*, vol. 246 (2002), pp. 287-298.

Vinogradov, V.L., "Determination of the melting parameters of aluminum nitride," High Temperatures—High Pressures, vol. 23 (1991), pp. 685-688.

International Search Report for PCT/US2006/045540, dated Mar. 20, 2007.

Arulkumaran et al., "Improved dc characteristics of AlGaN/GaN high-electron-mobility transistors on AlN/sapphire templates," (2002) *Applied Physics Letters*, vol. 81, No. 6, pp. 1131-1133.

Balkas et al., "Sublimation Growth and Characterizations of Bulk Aluminum Nitride Single Crystals," *J. Crystal Growth*, (1997) 179, p. 363.

Barin, *Thermochemical Data of Pure Substances*, 2nd Ed., (1993) pp. 42, 1334-1335, 1337, 1381-1382, 1636-1639.

Bickermann et al., "Characterization of bulk AlN with low oxygen content," *Jrl. of Crys. Growth*, vol. 269, Nos. 2-4, pp. 432-442, 2004.

Bockowski et al., "Combustion Synthesis of Aluminum Nitride Under High Pressure of Nitrogen and Nitrogen-Argon Mixtures," *5 J. Mat. Synthesis & Processing 6*, (1997) pp. 449-458.

Bolger et al., "Vaporization of the Nitrides of B, Al, and Ga," in Khim Fiz. Nitrodov, pp. 151-156 (1968) [Chem Abstr. 71, 34003j (1969)].

Chase et al., *J. Phys. Chem. Ref.* Data 14, Supplement No. 1 (1985).

Chase, *J. Phys. Chem.*, Ref. Data, Monograph No. 9, NIST-JANAF Thermochemical Tables, 4th Ed. (1998).

Chitnis et al., "Milliwatt Power AlGaN Quantum Well Deep Ultraviolet Light Emitting Diodes," *Phys. Sat. Sol.* (a), 2003 vol. 200, No. 1, pp. 99-101.

Constantin et al., "Mixing rocksalt and wurtzite structure binary nitrides to form novel ternary alloys: ScGaN and MnGaN," *Mat. Res. Soc. Syms. Proc.*, 799 (2004) Z9.5.1.

Cox et al., "On the Preparation, Optical Properties and Electrical Behaviour of Aluminum Nitride," *J. Phys. Chem. Solids*, (1967) vol. 28, pp. 543-548.

Dalmau et al. *Mat. Res. Soc. Proc.*, (2004) vol. 798, p. Y2.9.1.

DeVries et al., "Phase equilibria pertinent to the growth of cubic boron nitride," *J. Cryst. Growth*, 13/14 (1972) 88.

Dryburgh, "The Estimation of Maximum Growth Rate for Aluminum Nitride Crystals by Direct Sublimation " *J. Crystal Growth*, (1992) 125, pp. 65-68.

Dugger, "The single crystal synthesis and some properties of Aluminum Nitride", Air Force Cambridge Research Laboratories, Physical Science Research Papers, No. 656 (Aug. 1, 1975).

Dugger, The synthesis of Aluminum Nitride single crystals:, *Mat. Res. Bulletin*, 9 (1974) 331.

Epelbaum et al., "Sublimation growth of bulk AlN crystals: materials compatibility and crystal quality," *Mat. Sci. Forum*, (2002) 389-393, 1445.

Gorbatov et al., "Electrical Conductivity of Materials from Mixed Aluminum and Silicon Nitrides," *Sov. Powd. Met. Met. Ceram.*, (1970) vol. 9, pp. 917-920.

Hacke et al., "Photoluminescence Intensity and Spectral Distribution of GaN Films on SiC," (1999) *Phys. Stat. Sol.* (b), 216, 639.

Hermann et al., "Highly Si-doped AlN Grown by Plasma-Assisted Molecular-Beam Epitaxy," *Applied Phys. Letters*, (2005) vol. 86, pp. 192108-1-192108-3.

Honig, "Vapor Pressure Data for the Solid and Liquid Elements", *RCA Review* vol. 23 (1962) 567.

International Preliminary Resort on Patentabilit and Written Opinion for PCT/US2006/022329, 2007.
International Preliminary Report on Patentability and Written Opinion for PCT/US2006/045540, mailed Jun. 12, 2008.
International Preliminary Report on Patentability and Written Opinion for PCT/US2006/046300, mailed Jun. 12, 2006.
International Search Report and Written Opinion for PCT/US2007/011075, mailed Jul. 11, 2008.
International Search Report and Written Opinion for PCT/US2007/07980, mailed Oct. 12, 2007.
International Search Report and Written Opinion for PCT/US2008/000597, mailed May 20, 2008.
International Search Report and Written Opinion for PCT/US2008/001003, mailed Aug. 5. 2008.
International Search Report for PCT/US2006/022329, mailed Dec. 12, 2006.
International Search Report for PCT/US2006/045540, mailed Jul. 6, 2007.
International Search Report for PCT/US2006/046300, mailed May 30, 2007.
Jahnen et al., "Pinholes, Dislocations and Strain Relaxation in InGaN" *MRS Internet J. Nitride. Semicond. Res.*, (1998) 3:39.
Kanechika et al., "n-type AlN Layer by Si Ion Implantation," *Applied Phys. Letters*, (2006) vol. 88, pp. 202106.
Karel et al., "The luminescence properties of AlN with Manganese and rare earth activators under ultraviolet and cathode-ray excitation", *Czech. J. Phys.*, B20 (1970) 46.
Karpinski et al., "Equilibrium pressure of $N_2$ over GaN and high pressure solution growth of GaN", *J. Crust. Growth*, 66 (1984) 1.
Karpov et al., "Sublimation Growth of AlN in Vacuum and in a Gas Atmosphere" *Phys. Stat. Sol.* (a), (1999) 176, p. 435.
Kasu et al., "Formation of Solid Solution of Al1-xSixN (0<x?12%) Ternary Alloy " *Jap. J. Appl. Phys.*, (2001) vol. 40, Part 2, No. 10A, pp. L1048-L1050.
Kawabe et al., "Electrical and Optical Properties of AlN-a Thermostable Semiconductor" *Elec. Engin. In Japan*, (1967) vol. 87, pp. 62-70.
Khan "AlGaN Based Deep Ultraviolet Light Emitting Diodes with Emission from 250-280 nm.," Abstract and Presentation at the Int'l. Workshop on Nitride Semicond., Pittsburg, PA, Jul. 19, 2004.
Kordis, "The BeO-MgO system", *J. Nuc. Mater.*, 14 (1964) 322.
Lawson et al., "Preparation of Single Crystals", Academic Press, New York (1958) pp. 18-20.
Liu et al., "A Global Growth Rate Model for Aluminum Nitride Sublimation " *J. Electrochemical Soc.*, (2002) 149, p. G12.
Liu et al., "Characterization of AlN Crystals Grown by Sublimation," *Phys. Stat. Sol.* (a), (2001) 188, p. 769.
Liu et al., "Misfit Dislocation Generation in InGaN Epilayers on Free-Standing GaN," *Jap. J. Appl. Physics*, 2006 46:22, pp. L549-L551.
Ludwig et al., "Dimers $[Al_2N_4]$" *Zeitsch. f. Naturforsch.* B54 (1999) pp. 461-465.
Matthews et al., "Defects in Epitaxial Multilayers," *J. Crystal Growth* (1974) 27, p. 118.
Mokhov et al., "Sublimation growth of AlN bulk crystals in Ta crucibles," *Jrl. of Crys. Growth*, (Jul. 15, 2005) vol. 281, No. 1, pp. 93-100.
Naidu et al., Eds. "Phase Diagrams of Binary Tungsten Alloys," Indian Institute of Metals, Calcutta, pp. 7-13 (1991).
Nakanishi et al., "Effects of Al Composition on luminescence properties of europim implanted $Al_xGa_{1-x}N$ ($0 \angle x \angle 1$)", *Phys. Stat. Sol.* (c), 0 (2003) 2623.
Nassau et al., "The Physics and Chemistry of Color," Wiley-Interscience Publication (New York 1983).
Niewa et al., "$Li_3[ScN_2]$: The first nitridoscandate (III)—Tetrahedral Sc Coordination and unusual MX2 framework", *Chem. Eur. J.* 9 (2003) 4255.
Niewa et al., "Recent developments in nitride chemistry", *Chem. Mater.*, 10 (1998) 2733.
Noveski et al., "Growth of AlN Crystals on AlN/SiC Seeds by AlN Powder Sublimation in Nitrogen Atmosphere," *MRS Internet J. Nitride Semicond. Res.*, 2004 9, 2.
Noveski et al., "Mass Transfer in AlN Crystal Growth at High Temperatures," *J. Crystal. Growth*, (2004) 264, pp. 369-378.
Office Action in Japanese Patent Application No. 2003-579324, May 27, 2008 (English Translation).
Parker et al., "Determination of the critical layer thickness in the InGaN/GaN heterostructures," *Applied Phys. Letters.*, (1999) vol. 75, No. 18, pp. 2776-2778.
Proc. of NATO Advanced Study Inst. on Nitrogen Ceramics, University of Kent, Canterbury, U.K. (1976).
Raghothamachar et al., "Synchrotron White Beam Topography Characterization of Physical Vapor Transport Grown AlN and Ammonothermal GaN," *J. Crystal Growth*, (2002) 246, pp. 271-280.
Raghothamachar et al., "X-ray Characterization of Bulk AlN Single Crystals Grown by the Sublimation Technique," *J. Crystal Growth*, (2003) 250(1-2), pp. 244-250.
Rojo et al., "Growth and Characterization of Epitaxial Layers on Aluminum Nitride Substrates Prepared from Bulk, Single Crystals," *J. Crystal Growth*, (2002) 240, p. 508.
Rojo et al., "Report on the Growth of Bulk Aluminum Nitride and Subsequent Substrate Preparation," *J. Crystal Growth*, (2001) 231, p. 317.
Schlesser et al., "Growth of AlN Bulk Crystals from the Vapor Phase," *Mat. Res. Soc. Symp. Proc.*, (2002) 693, p. I9.4.1.
Schlesser et al., "Seeded Growth of AlN Bulk Single Srystals by Sublimation," *J. Crystal. Growth*, 241, pp. 416-420, 2002.
Schowalter et al., "Fabrication of Native, Single-Crystal AlN Substrates," *Phys. Stat. Sol.* (c), (2003) 1-4.
Segal et al., "On Mechanisms of Sublimination Growth of AlN bulk Crystals," *J. Crystal Gowth*, (2000) 211, pp. 68-72.
Shih et al, "High-quality and crack-free $Al_xGa_{1-x}N$ (x-0.2) grown on sapphire by a two-step growth method," *Jrl. of Crys. Growth*, (Apr. 15, 2005) vol. 277, No. 1-4, pp. 44-50.
Silveira et al., "Excitonic Structure of Bulk AlN from Optical Reflectivity and Cathodoluminescense Measurements," *Phys. Review* B71, 041201® (2006).
Singh et al., "Physical Vapor Transport Growth of Large AlN Crystals," *J. Cryst. Growth*, (2003) 250, p. 107.
Slack et al., "AlN Single Crystals," *J. Crystal Growth*, (1977) 42, pp. 560-563.
Slack et al., "Properties of Crucible Materials for Bulk Growth of AlN," *Mat. Res. Soc. Proc.*, (2004) vol. 798, pp. Y10.74.1-Y10.74.4.
Slack et al., "Some Effects of Oxygen Impurities on AlN and GaN," *J. Crystal Growth*, (2002) 246, pp. 287-298.
Smart et al., "AlGaN/GaN Heterostructures on Insulating AlGaN Nucleation Layers," *Appl. Phys. Letters*, (1999) 75, p. 388.
Solid State Lighting Report (Dept. of Energy, 2007).
Song, "Strain relaxation due to V-pit formation in $InxGa1-xN$/GaN epilayers grown on sapphire," *J. Applied Phys.*, (2005) 98: 084906.
Sun et al., "Phase relationships in the system Y-Al-O-N", *Mater. Letters*, 3-4 (1991) 76.
Takeuchi et al., "Optical Properties of Strained AlGaN and GaInN on GaN," *Jap. J. Appl. Phys.*, (1997) vol. 36, pp. L177-L179.
Takeya et al., "Degradation in AlGaInN Lasers," *Phys. Stat. Sol.* (c), (2003) 0, No. 7, pp. 2292-2295.
Taniyasu et al., "An aluminum nitride light-emitting diode with a wavelength of 210 nanometres", *Nature*, 441 (2006) 325.
Taniyasu et al., "Intentional control of n-type conduction for Si-doped AlN and $Al_xGa_{1-x}N$ ($0.42 \angle x \angle 1$)", *Applied Physics Letters*, 81 (2002) 1255.
Tavernier et al., "Chemical Mechanical Polishing of Gallium Nitride," *Electrochemical and Solid State Latters*, 2002 vol. 5, No. 8, pp. G61-G64.
Tomiya et al., "Dislocations in GaN-Based Laser Diodes on Epitaxial Lateral Overgrown GaN Layers," *Phys. Stat. Sol.* (a), (2001) vol. 188, No. 1, pp. 69-72.
Tsao, "Solid-State Lighting: Lamps, Chips and Materials for Tomorrow," *IEEE Circuits and Devices Magazine*, (2004) 20, pp. 28-37.
Van de Walle et al., "Doping of AlGaN Alloys," *MRS Internet J. Nitride Semicond. Res.*, (1999) 4S1, G10.4, pp. 1-12.
Van de Walle et al., "DX-center Formation in Wurtzite and Zinc-blende $AlxGa1-xN$," *Phys. Rev.*, (1998) B57, R2033.

Vendl et al., "The melting points of some rare-earth metal nitrides as function of the nitrogen pressure", *High Temperatures—High Pressures*, 9 (1977) 313.

Venugopal et al., "Comparison of Various Buffer Schemes to Grow GaN on Large-Area Si(111) Substrates Using Metal-Organic Chemical-Vapor Deposition," *32 J. Electronic Mat.*, vol. 32, No. 5 (2003) pp. 371-374.

Wentorf Jr., "Synthesis of the cubic form of boron nitride", *J. Chem. Phys.*, 34 (1961) 809.

Yamane et al., "Preparation of GaN single crystals using a Na flux", *Chem. Mater.*, 9 (1997) 413.

Yano et al., "Growth of nitride crystals, BN. AlN and GaN by using a Na flux", *Diamond and Related Materials*, 9 (2000) 512.

Zeisel et al., "DX-behavior of Si in AlN," *Phys. Rev.*, (2000) B61, R16283.

Zhuang et al., "Seeded growth of AlN single crystals by physical vapor transport," *Jrl. of Crys. Growth*, (Jan. 25, 2006), vol. 287, No. 2, pp. 372-375.

International Preliminary Report on Patentability and Written Opinion for PCT/US2007/011075, mailed Nov. 20, 2008.

Office Action in European Patent Application No. 02806723.9, dated Aug. 8, 2008, 3 pages.

Partial International Search Report for International Application No. PCT/US2007/11075, dated May 7, 2008.

* cited by examiner

LARGE ALUMINUM NITRIDE CRYSTALS WITH REDUCED DEFECTS AND METHODS OF MAKING THEM

CROSS-REFERENCE TO RELATED APPLICATION

The present application claims the benefits of and priority to U.S. Provisional Application Ser. No. 60/740,082, filed on Nov. 28, 2005, the entire disclosure of which is hereby incorporated by reference.

GOVERNMENT SUPPORT

This invention was made with United States Government support under 70NANB4H3051 awarded by the National Institute of Standards and Technology (NIST). The United States Government has certain rights in the invention.

BACKGROUND

Aluminum nitride (AlN) holds great promise as a semiconductor basis material for numerous applications, e.g., optoelectronic devices such as short-wavelength LEDs and lasers, dielectric layers in optical storage media, electronic substrates, and chip carriers where high thermal conductivity is essential, among many others. In principle, the properties of AlN will allow light emission in the 200 nm wavelength region to be achieved. But many practical difficulties should be addressed for such devices to become commercially practicable.

For example, bulk AlN crystals often exhibit a substantial amount of cracking, which results in crystal separation before, during or after the crystal is formed into a wafer. If the crystal cracks or fully separates, it is very difficult or sometimes impossible to use it as a reliable substrate for device fabrication. Most of the commercially available machines for epitaxy, photolithography and other device processing require perfectly shaped, round wafers with uniform thickness. Any crack, even ones that do not result in wafer separation, will impair commercial usefulness. Therefore, the cracking problem in AlN crystal growth has crucial importance for the further development of nitride-based electronics.

In addition, many opto-electronic applications will require transparent wafers. While AlN is intrinsically transparent at optical wavelengths between 210 and 4500 nm, macroscopic defects such as cracks and inclusions significantly scatter light and reduce the apparent transparency in this important optical region. Elimination of cracks and inclusions is of critical importance to the development of ultraviolet light emitting diodes (LEDs), for example.

DESCRIPTION OF THE INVENTION

Brief Summary of the Invention

Microvoids (MVs) in AlN single crystals are a type of crystallographic defect that can be classified as an inclusion. The lateral (i.e. parallel to the c-plane) size of the MV defects typically varies from 0.1 to 3 micrometers (µm). Under low resolution ($\leq 100\times$) optical microscopy, the MVs appear to be spherically shaped inclusions. However, under higher ($\geq 200\times$) resolution optical microscopy, as well as when imaged using Atomic Force Microscopy (AFM), the MVs appear to have a hexagonal shape well aligned with (i.e., approximately parallel to) the c-plane. During chemical treatment (chemical etching or chemical-mechanical polishing), MVs intersecting an AlN surface leave shallow pits with a round or hexagonal shape. Also, AlN material with a significant density of MVs tends to etch faster (during chemical etching) than the material with somewhat lower MV density. Therefore, the MVs can behave as heterogeneous inclusions in the AlN solid phase. The MVs may be associated with a gas-phase segregation, e.g. of oxygen, nitrogen, or hydrogen. MVs containing segregated gaseous species can lower the stacking symmetry of the AlN parallel to the c-axis thus representing stacking faults. In crystals grown by sublimation-recondensation (such as described in U.S. Pat. No. 6,770,135, the entire disclosure of which is hereby incorporated by reference), the volume density can be about $10^9$ cm$^{-3}$ and the surface density of MVs (i.e., MVs which either intersect the surface after cutting or are within 1 µm of the surface) can be about $10^5$ cm$^{-2}$.

We have found that reducing the MV density in AlN ameliorates numerous problems related to cracking during crystal growth, etch pit generation during the polishing, reduction of the optical transparency in an AlN substrate, and, possibly, growth pit formation during epitaxial growth of AlN and/or AlGaN. The ability to address these problems by reducing MV formation facilitates practical crystal production strategies and the formation of large, bulk AlN crystals with low defect densities—e.g., a dislocation density below $10^4$ cm$^{-2}$, an inclusion density below $10^4$ cm$^{-3}$ (MVs are a type of inclusion) and/or a MV density below $10^4$ cm$^{-3}$. The invention also facilitates fabrication of single-crystal wafers of AlN ready for epitaxial growth and oriented within 2° of the (0001) face (c-face) with the Al polarity, and having a shallow pit density of less than 100 cm$^{-2}$. Embodiments of the invention further facilitate formation of single-crystal wafers of AlN that are at least 2 cm in diameter having an optical absorption coefficient of less than 1 cm$^{-1}$ over any part of the wavelength range where AlN is intrinsically transparent spanning from 210 nm to 4,500 nm. Embodiments of the invention also permit fabrication of substantially crack-free boules of single-crystal AlN having diameters larger than 2 cm and lengths greater than 1 cm. The term "wafer," as utilized herein, refers to a self-supporting substrate and/or portion of a boule of material such as AlN. The term "substantially crack-free," as utilized herein, refers to a crack density of less than 5 cracks per boule or volume of single crystal material which is approximately 2 cm diameter by 1 cm in length, or less than 10 cracks per two-inch (2") diameter wafer, where the cracks are typically less than approximately 2 cm in length. Alternatively, it can refer to approximately zero cracks in a crystal boule or portion thereof, or can refer to a finite crack density insufficient to cause separation of a portion of the crystal boule during growth, cool-down, slicing, or other handling procedures.

Accordingly, in a first aspect the invention features a method of growing single-crystal AlN including providing in a crystal growth enclosure a vapor comprising Al and $N_2$, and depositing the vapor as single-crystalline AlN having a microvoid density less than approximately $10^4$ cm$^{-3}$. In an embodiment, the partial pressure of $N_2$ in the crystal growth enclosure may be maintained at a level greater than a stoichiometric pressure relative to the Al. The partial pressure of $N_2$ may be within the range of 1-50 bar.

One or more of the following features may be included. A growth rate of the single-crystalline AlN in any crystallographic direction may be within the range of approximately 0.1 to approximately 2 mm/hr. A push rate less than or equal to the intrinsic growth rate of the single-crystalline AlN may be maintained. The push rate may be at least 0.1 mm/hr.

Deposition of the single-crystalline AlN may originate at a seed crystal disposed within the crystal growth enclosure and oriented such that a direction of maximum growth rate of the single-crystalline AlN is rotated at least approximately 10° away from a c-axis of the single-crystalline AlN and toward a non-polar direction. The oxygen concentration in the vapor may be less than 300 parts per million (ppm) atomic percent, and the hydrogen concentration in the vapor may be less than 0.5%. The crystal growth enclosure may include tungsten, and the growth temperature may be less than approximately 2350° C. The crystal growth enclosure may include at least one of tantalum and carbon, and the growth temperature may be less than approximately 2750° C. The temperature gradient along a length of the crystal growth enclosure may be greater than approximately 5° C./cm and less than approximately 100° C./cm.

The method may further include, following deposition, the step of slicing an AlN wafer from the single-crystalline AlN. The cross-sectional area of the AlN wafer may be approximately equal to that of the single-crystalline AlN, and may be approximately circular with a diameter greater than approximately 2 cm.

One or more of the following features may be included. The method may include the step of annealing the AlN wafer at a first temperature and a first pressure. The first temperature may be greater than approximately 2000° C. and the first pressure may be greater than approximately 35 bar. The first temperature may be less than approximately 2350° C. After annealing, the microvoid density in a center region of the AlN wafer may be less than the density in an edge region of the AlN wafer, and may be less than approximately $10^4$ cm$^{-3}$, or even approximately zero.

The method may include the step of polishing the AlN wafer, wherein after polishing the AlN wafer has an etch pit density less than approximately 100 cm$^{-2}$. In some embodiments, the method includes the step of depositing an epitaxial layer on the AlN wafer, wherein the epitaxial layer has a surface pit density less than approximately 100 cm$^{-2}$. In another embodiment, the microvoid density of the single-crystalline AlN is greater than zero and the single-crystalline AlN is substantially crack-free.

In another aspect, the invention features a bulk AlN crystal having a dislocation density below $10^4$ cm$^{-2}$ and an inclusion density below $10^4$ cm$^{-3}$. In an embodiment, the microvoid density of the crystal is less than approximately $10^4$ cm$^{-3}$.

In yet another aspect, the invention features a single-crystal wafer of AlN oriented within 2° of the (0001) face with the Al polarity, the wafer having a shallow pit density less than 100 cm$^{-2}$. In an embodiment, the wafer is substantially crack-free. The microvoid density in a center region of the wafer may be less than the density in an edge region of the wafer. For example, the microvoid density in a center region of the wafer may be approximately zero and the microvoid density in an edge region of the wafer may be less than approximately $10^4$ cm$^{-3}$.

In another aspect, the invention features a single-crystal wafer of AlN having an optical absorption coefficient of less than 5 cm$^{-1}$ at all wavelengths in the range spanning 500 nm to 3,000 nm. In an embodiment, the wafer is substantially crack-free. A microvoid density in a center region of the wafer may be less than a microvoid density in an edge region of the wafer. The microvoid density in a center region of the wafer may be approximately zero and the microvoid density in an edge region of the wafer may be less than approximately $10^4$ cm$^{-3}$. In an embodiment, the optical absorption coefficient may be less than 1 cm$^{-1}$ at all wavelengths in the range spanning 500 nm to 3,000 nm. The wafer may have a diameter greater than approximately 2 cm.

In another aspect, the invention features a single-crystal wafer of AlN having an optical absorption coefficient less than 1 cm$^{-1}$ at any wavelength in the range spanning 210 nm to 4,500 nm and a diameter greater than approximately 2 cm.

In yet another aspect, the invention features a boule of crack-free, single-crystal AlN having a diameter larger than 2 cm and a length greater than 1 cm. In an embodiment, the boule may have a microvoid density in the range of greater than zero to less than approximately $10^4$ cm$^{-3}$.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION OF THE PREFERRED EMBODIMENTS

Figure 1:
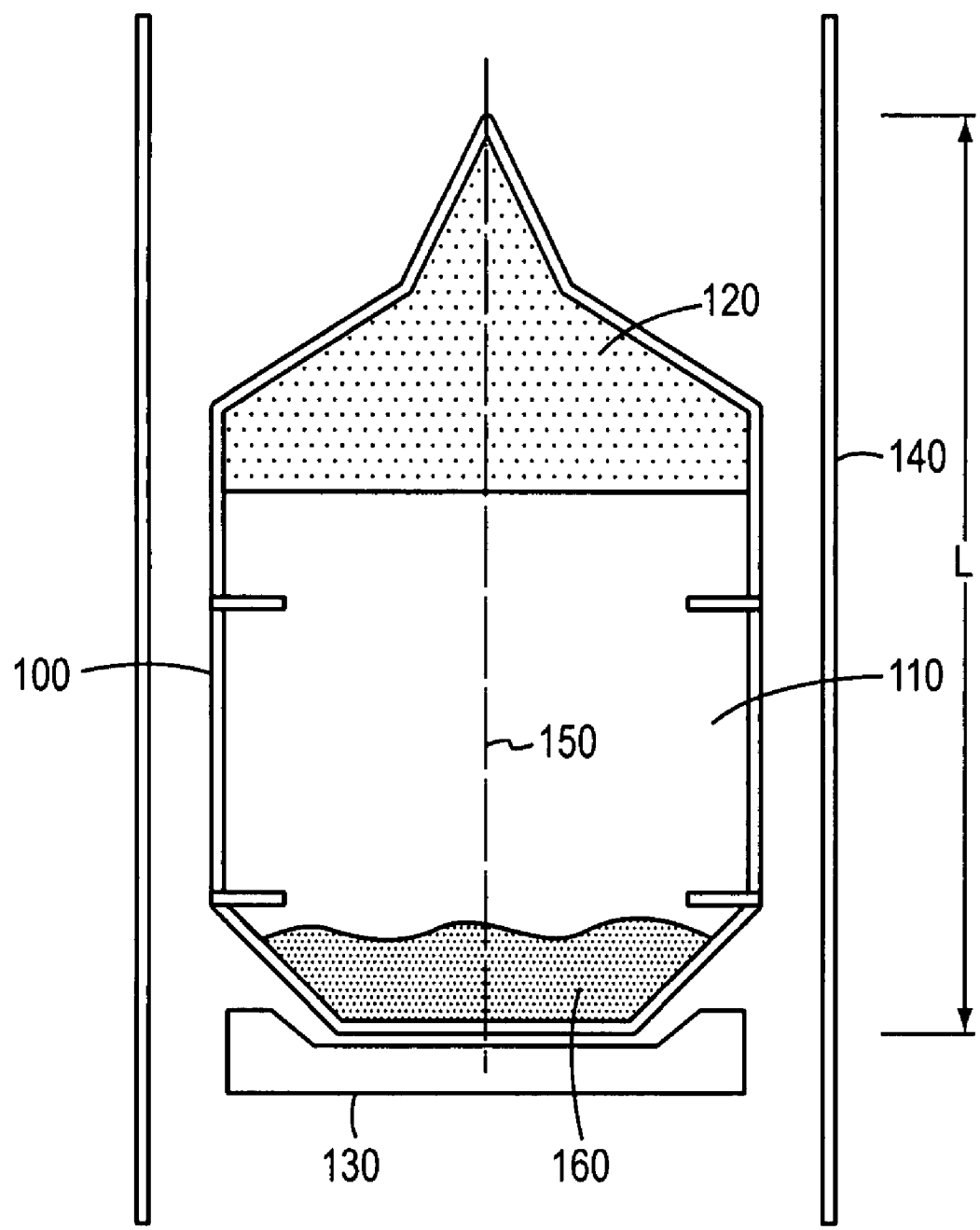
FIG. 1 schematically depicts a crystal growth enclosure for the growth of single-crystalline AlN.

Coalescence of MVs can result in their lining up parallel to the prismatic $\{1\bar{1}00\}$ planes (i.e., m-planes) in an AlN crystal. In several cases we observed MVs creating tree-like features where the tree branches represent lining up of MVs that often evolve into a solid tree (crack or micro-crack). Another type of crack formation due to MV coalescence—a rare but still significant case—occurs when MVs form a few circles from their common center from which the crack spreads out almost to 180°. Moreover, since some of the MVs intersect the surface, they can influence the polishing process by producing etch pits.

MVs can reduce the optical transparency of an AlN substrate. To first order, the reduction in transparency can be modeled by assuming that the amount of radiation scattered by the MVs is proportional to the effective area presented by the MVs. At low densities of MVs, this means that the reduction in transmission of radiation through a slab of AlN with thickness d, will be equal to ndA where n is the numerical density of MVs and A is the effective area each MV presents to scatter the radiation. The transmission T through a uniform slab of material of thickness d is normally expressed in terms of an absorption coefficient α such that $T=e^{-\alpha d}$. In this model, the absorption coefficient will be approximately equal to nA and will be independent of wavelength. If the effective area A that the MVs present to scatter radiation is ~1 μm$^2$, then the density of MVs is preferably below ~$10^8$ cm$^{-3}$ in order to achieve an absorption coefficient that is less than 1 cm$^{-1}$. Indeed, this calculation corresponds to optical absorption measurements on AlN.

The three distinct colorations of AlN substrate wafers are observed. Depending on growth conditions, sometimes these colorations can all be observed in a single-crystal AlN wafer. The colorations can be described as:

1) Dark (brownish);
2) Yellow (amber); and
3) Light yellow.

The dark area usually contains a high density of MVs that are easily observed. MVs are harder to observe in the yellow area due to the lack of optical contrast (MVs and amber material are both bright). Also, in some cases, the density of MVs in the yellow area is smaller than that in darker region. It is even harder to see MVs in large yellow regions, but again, that may be due to the contrast or because light yellow regions represent grains that are usually oriented strongly off-axis. It appears, however, that the most important difference between the dark and yellow regions is that MVs in the dark region are normally connected to each other, creating a network, while the MVs in the yellow areas do not exhibit this feature.

The present invention also stems from the recognition that generation of MVs during AlN crystal growth makes it easier for the AlN crystal to crack. Therefore, embodiments of the present invention prevent or reduce MV generation in order to prevent or reduce cracking. This may be accomplished through adjustment and control of one or more of:

1) The expansion rate of the crystal;
2) The gas mixture;
3) The ambient pressure;
4) The growth temperature;
5) The temperature gradients;
6) The push rate; and/or
7) The post-growth annealing.

1) Expansion Rate

There are two main directions of the crystal expansion during crystal growth: lateral and vertical. MV formation can be controlled by controlling the expansion rate because MVs can form due to vacancy aggregation. If the AlN crystal is grown under stochiometric gas phase conditions (i.e., the number of Al and N atoms in the vapor phase is equal), then there will not be enough single nitrogen (N) atoms to bond to each aluminum atom in the crystal lattice due to the very high bonding energy of the $N_2$ molecule (~9.76 eV at 0 K). The overall effect of single N atoms provided to the growth surface can be described by introducing an effective accommodation coefficient that is less than 1 if the number of single N atoms at the growing surface is less than the number of $N_2$ molecules arriving at the surface. When the number of single N atoms incorporated into the crystal is less than the number of the Al atoms, excess Al atoms will be trapped in the crystal.

Too high a growth rate (expansion) in any direction will result in the trapping of excess Al atoms in the crystal, thus creating N vacancies. These N vacancies, in turn, can later aggregate and generate MVs. In order to minimize or completely avoid formation of MVs, the growth rate in any crystallographic direction is preferably kept in the range from 0.1 to 2 mm/hr. The lower growth rate limit is defined by practical considerations for creating bulk crystals from vapor-phase constituents, while the upper growth limit is defined by the desired crystalline quality of grown crystal: as the growth rate increases, the fracture of polycrystalline material increases as well. The maximum growth rate will also depend on the crystallographic orientation of the growing crystal.

It is important to note that a expansion rate may result in generating different types of point defects (vacancies) such as pairs of Al and N vacancies (see, e.g., G. A. Slack, L. J. Schowalter, D. Morelli, J. A. Freitas Jr., *J. Crystal Growth*, vol. 246, p. 287 (2002), the disclosure of which is hereby incorporated by reference), especially when oxygen is present in the vapor phase. Any vacancies can aggregate and generate MVs.

Hence, referring to FIG. 1, according to various embodiments, during growth of single-crystalline AlN, a crystal growth enclosure 100 contains a vapor mixture 110 and a single-crystal AlN boule 120. Vapor mixture 110 includes primarily gaseous Al and $N_2$, and arises from the sublimation of source 160. Boule 120 is formed by the recondensation of vapor mixture 110 at a top end of crystal growth enclosure 100, and may originate from a seed crystal (not pictured). The growth rate of boule 120 can be defined as the increase in size of boule 120, for example, parallel or perpendicular to longitudinal axis 150 of crystal growth enclosure 100. The direction of maximum growth rate of boule 120 is generally along longitudinal axis 150. The MV density of boule 120 can be kept below a level of approximately $10^4$ cm$^{-3}$ by maintaining the growth rate of boule 120 in the range of 0.1 to 2 mm/hr. In an embodiment, the MV density of boule 120 is greater than zero. The seed crystal may be oriented such that the direction of maximum growth rate of boule 120 is oriented at least approximately 10° away from the c-axis and towards a non-polar direction, i.e., a c-axis of boule 120 may be oriented at least approximately 10° away from longitudinal axis 150. Such a seed crystal orientation may act to suppress MV formation.

2) Gas Mixture

The purity and the composition of the gas mixture are important parameters in controlling generation of MVs. Forming gas contains hydrogen (usually ≦5% by volume) and is used in order to reduce possible oxygen contamination. However, hydrogen molecules can be easily trapped in the AlN material (as is the case with other semiconductors as well). By diffusion as interstitials, these hydrogen atoms can agglomerate and create MVs. Oxygen contamination may result from several sources including residual water vapor and contaminated supply gases. Once in the crystal crucible, it may be transported as $Al_2O$ in the vapor phase and attach to the Al sites in the crystal lattice, thus creating Al vacancies. The Al vacancies can aggregate and create MVs. Accordingly, using high-purity gases with low amounts of hydrogen and oxygen will reduce the probability of MV formation. The use of UHP-grade $N_2$ gas, applicable in the semiconductor industry, is desirable. However, additional steps need to be taken, including the use of nitrogen gas filters to purify the $N_2$ gas being introduced, as well as the use of gas flow to remove contamination from the furnace elements as they heat up. For example, the UHP-grade nitrogen gas can be passed through an Aeronex filter (model SS2500KFH4R, max flow 300 SLM, filtration 0.003 μm). The delivery rate to the hot zone can be 0.125 liter per minute (LPM) although the optimum gas volume delivered to the reaction zone will vary based on the specific geometry.

Thus, in an embodiment, the concentration of hydrogen in vapor mixture 110 is less than 0.5%. In another embodiment, the concentration of oxygen in vapor mixture 110 is less than 300 parts per million (ppm) atomic percent. Maintenance of low hydrogen and oxygen concentrations in vapor mixture 110 prevent formation of point defects in boule 120 that can agglomerate and form MVs. Thus, the MV density in boule 120 can be maintained below approximately $10^4$ cm$^{-3}$. In an embodiment, the MV density of boule 120 is greater than zero.

3) Ambient Pressure

The evaporation of AlN is nearly congruent. The equilibrium vapor phase of evaporated AlN consists almost exclusively of Al atoms and $N_2$ molecules at the temperatures typically used for crystal growth (1900 to 2450° C.). For the AlN crystal to grow, $N_2$ molecules that are adsorbed on the surface must be broken into atomic N in order to be incorporated into the growing crystal. As stated above, the lack of sufficient N atoms present at the growth surface results in generation of N vacancies that can cause formation of MVs. In order to provide a sufficient source of N atoms, the partial pressure of $N_2$ is preferably increased well above the stochiometric value (or, alternatively, the growth temperature increased). The higher the ambient $N_2$ pressure, the higher the amount of atomic N that will be generated on the growing crystal surface and available for incorporation into the crystal. Thus, higher $N_2$ partial pressure reduces the probability of MV formation. The ambient $N_2$ pressure is preferably, therefore, kept as high as possible in order to provide sufficient atomic N flux to the growing interface; see, e.g., U.S. Pat. No. 6,770,135. The ranges needed to grow AlN crystals from vapor phase are 1-50 bar where the lower limit is defined by the lowest $N_2$ pressure required to obtain high quality AlN crystals, while the upper limit is defined by the reasonable growth rate as increasing the ambient pressure results in a diffusion-limited growth regime.

Thus, in an embodiment, vapor mixture 110 contains a partial pressure of $N_2$ greater than the stoichiometric pressure relative to the partial pressure of Al, i.e., the number of N atoms in vapor mixture 110 is greater than the number of Al atoms in vapor mixture 110. Maintenance of this high partial pressure of $N_2$ relative to Al prevents the formation of N vacancies which can agglomerate and form MVs. In an embodiment, the partial pressure of $N_2$ in vapor mixture 110 is in the range of 1 to 50 bar. Thus, the MV density in boule 120 can be maintained below approximately $10^4$ $cm^{-3}$. In an embodiment, the MV density of boule 120 is greater than zero.

4) Growth Temperature and 5) Temperature Gradients

An insufficient growth temperature results in polycrystalline growth, which increases the defect density and, therefore, the formation of MVs. Moreover, lower growth temperatures decrease the surface concentrations of monatomic N and therefore lead to N vacancies, which, in turn, further contribute to MV formation. Very high temperature gradients also result in polycrystalline growth and should also be avoided in order to reduce the possibility of MV generation. The highest acceptable growth temperature is generally limited by the possible formation of eutectic solutions of AlN with the crucible, so the temperature regimes employed should be judiciously chosen. For instance, the highest possible growth temperature at 1 bar pressure would be 2330° C. (see, e.g., Glen A. Slack and T. F. McNelly, "Growth of high purity AlN crystals," *J Cryst. Growth*, vol. 34, pp. 263-279 (1976) and Glen A. Slack, Jon Whitlock, Ken Morgan, and Leo J. Schowalter, "Properties of Crucible Materials for Bulk Growth of AlN," Mat. Res. Soc. Symp. Proc. Vol. 798, p. Y10.74.1 (2004) ("Slack 2004"), the entire disclosures of which are hereby incorporated by reference), since above this temperature AlN will form a liquid eutectic with the crucible and destroy it. Higher temperatures can be achieved by using other crucible materials such as suggested in Slack 2004. However, problems with contamination and leakage through the crucible walls may be anticipated. Leakage through polycrystalline crucibles may be addressed using the techniques described in U.S. Pat. No. 6,719,843 and in U.S. patent application Ser. No. 10/822,336, the entire disclosures of which are hereby incorporated by reference.

In any case, the maximum temperature of growth by sublimation-recondensation will be limited to less than approximately 2750° C. Above, this temperature, AlN has been observed to melt at an elevated nitrogen pressure of 10 megaPascals (MPa) (see V. L. Vinogradov, A. V. Kostanovskii, and A. V. Kirillin, "Determination of the Melting Parameters of Aluminium Nitride," *High Temperatures—High Pressures*, vol. 23, p. 685 (1991), the disclosure of which is herein incorporated by reference). It is anticipated that the highest temperature gradient at which MV formation will be diminished is less than approximately 100° C./cm. The temperature gradient is related to both expansion rate and vertical growth rate. In case of MV formation due to too high an expansion rate or vertical growth rate, then controlling the temperature gradients (radial and axial) can limit the MV formation as well as their further migration and agglomeration.

Referring to FIG. 1, heat source 140 surrounds crystal growth enclosure 100 and regulates the growth temperature therein. Moreover, the local temperature at various points in heat source 140, as well as the speed of travel of crystal growth enclosure 100 through heat source 140 (i.e., the push rate described below), control the thermal gradient in boule 120. The thermal gradient is defined herein as the change in temperature of the boule as a function of distance along the length L of the crystal growth enclosure.

In an embodiment, heat source 140 is regulated such that the growth temperature inside crystal growth enclosure 100 is less than approximately 2350° C. and crystal growth enclosure 100 is made primarily of tungsten. In a preferred embodiment, crystal growth enclosure 100 is made primarily of tungsten and the growth temperature falls within a range of 1900 to 2350° C. In another embodiment, crystal growth enclosure 100 is made primarily of niobium carbide (NbC) and the growth temperature falls within a range of 1900 to 2350° C. In another embodiment, crystal growth enclosure 100 is made primarily of tantalum carbide (TaC) or tantalum (Ta) coated with a layer of carbon (C) and the growth temperature falls within a range of 1900 to 2400° C. The layer of C may be formed on crystal growth enclosure 100 made primarily of Ta by chemical vapor deposition. In another embodiment, crystal growth enclosure 100 is made primarily of C and the growth temperature falls within a range of 1900 to 2750° C., or, preferably, within a range of 1900 to 2550° C.

In an embodiment, the thermal gradient of boule 120 is maintained at a level greater than approximately 5° C./cm and less than approximately 100° C./cm. This high thermal gradient prevents the formation of MVs at a level greater than approximately $10^4$ $cm^{-3}$, and maintains growth of boule 120 as a single crystal rather than as polycrystalline material. In an embodiment, the MV density of boule 120 is greater than zero.

6) Push Rate

There is an optimum push rate at which MV generation is negligible. Preferably, the push rate is slightly less than or equal to the intrinsic, or maximum, growth rate (as stated above, 0.1-2 mm/hr). If this condition is not obeyed, then the crystal growth rate in the growth direction may be too high, resulting in MV formation as explained above. Moreover, a high push rate may lead to the nucleation of AlN on the walls of a tungsten crucible, which, in turn, will increase the defect density and the possibility of MV generation. In addition, higher push rates may result in the predominate growth of other planes rather than c-planes, an effect that further contributes to MV formation.

However, the push rate should not be too low (<0.1 mm/hr) since a tungsten crucible degrades if exposed to the Al vapor for a very long time. The Al vapor attacks the crucible wall along its grain boundaries and other defects, resulting in leakage of some Al vapor and consequent pore formation in the growing material. Therefore, it is desirable to choose the push rate so as to reduce MV formation.

Referring to FIG. 1, crystal growth enclosure 100 also includes push mechanism 130, which controls the travel of crystal growth enclosure 100 through surrounding heat source 140, thereby controlling both the push rate and the thermal gradient along the longitudinal axis 150. The push rate is defined as the speed at which push mechanism 130 propels crystal growth enclosure 100 through heat source 140. In an embodiment, the push rate is maintained at a level less than or approximately equal to a maximum growth rate of boule 120 in the direction parallel to the longitudinal axis 150. Here, the maximum growth rate is defined by the maximum rate allowed by the crystal growth temperature and the source temperature. In a preferred embodiment, the push rate is maintained at a level of approximately one-half the maximum growth rate of boule 120. Thus, the MV density in boule 120 can be maintained below approximately $10^4$ cm$^{-3}$. In an embodiment, the MV density of boule 120 is greater than zero.

As used herein, the push rate can also be defined as an actual growth rate maintained at a level below that enabled by the specific growth conditions, e.g., the growth temperature and the source temperature. Maintenance of a specific push rate can also be equivalently accomplished without physical movement of crystal growth enclosure 100. For example, heat source 140 could be moved relative to a stationary crystal growth enclosure 100, or the distance or temperature gradient between boule 120 and source 160 can be altered. Generally, any of these methods in which actual growth rate is controlled at a level below the maximum intrinsic growth rate can be utilized interchangeably with push rate.

7) Post-Growth Annealing

Figure 2A:
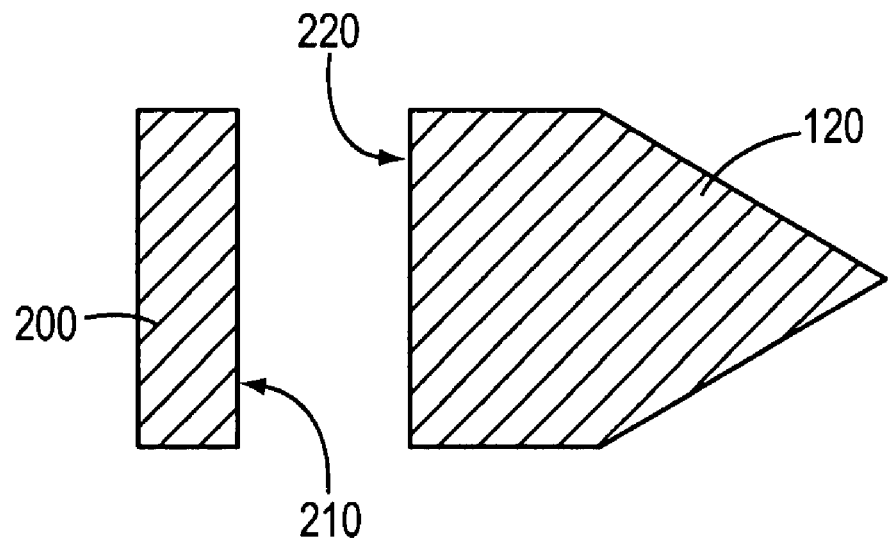
FIGS. 2A and 2B schematically depict an AlN wafer separated from a boule of single-crystalline AlN.
Figure 2B:
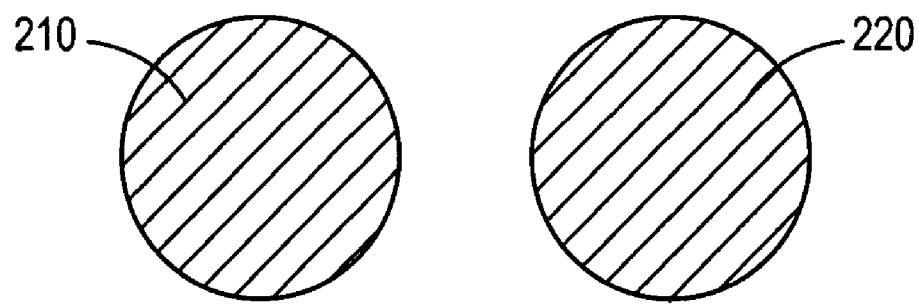

Referring to FIGS. 2A and 2B, wafer 200 may be sliced from boule 120 by the use of, for example, a diamond annular saw or a wire saw. Maintaining an MV density less than approximately $10^4$ cm$^{-3}$ in boule 120 substantially prevents crack formation in both boule 120 and wafer 200. Such cracks can result in, among other effects, separation of small portions of either boule 120 or wafer 200 during wafer slicing. Thus, through the prevention of crack formation, a surface 210 of wafer 200 may have substantially the same shape and cross-sectional area of a surface 220 of boule 120. In an embodiment, surface 210 may be approximately circular in shape and have a diameter of greater than approximately 2 cm. In an alternate embodiment, surface 210 may be a quadrilateral or other polygon with an area greater than approximately 3 cm$^2$.

In an embodiment, a crystalline orientation of surface 210 may be within approximately 2° of the (0001) face (i.e., the c-face) and have an Al polarity. In other embodiments, surface 210 may have a N polarity or be oriented within approximately 2° of the m-face or a-face orientation.

Figure 3:
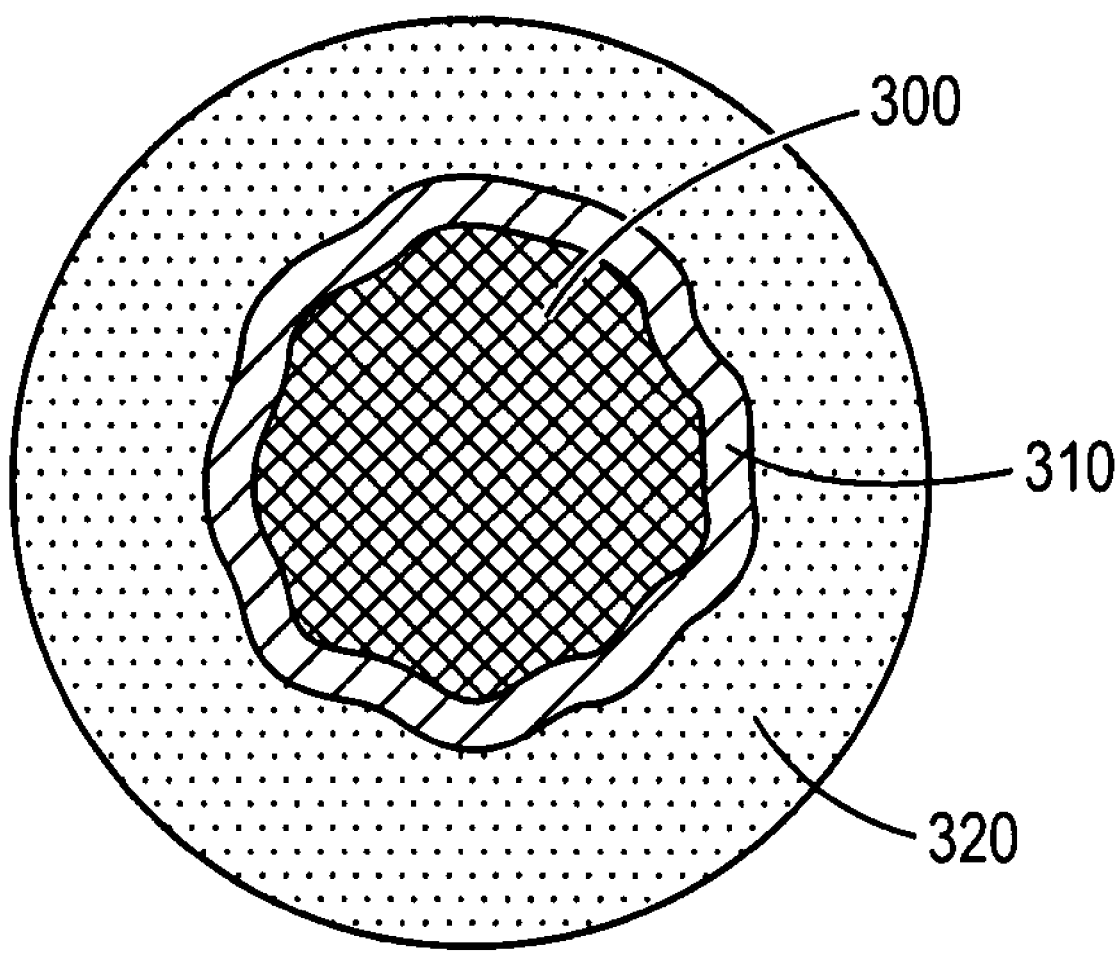
FIG. 3 schematically depicts an AlN wafer exhibiting domains of differing MV density.

Referring to FIG. 3, wafer 200 may be annealed to reduce the density of MVs therein. The annealing temperature may be in the range spanning 1000 to 2350° C. In a preferred embodiment, the annealing temperature is approximately 2000° C. In yet another embodiment, wafer 200 is subjected to high pressure during annealing. The annealing pressure may be selected from the range of 1 to 50 bar, and in a preferred embodiment, the annealing pressure is approximately 35 bar. In an embodiment, wafer 200 may be annealed in an ambient including $N_2$ gas. In another embodiment, wafer 200 may be annealed at a temperature of approximately 1200° C. and a pressure of approximately 2 bar.

Annealing of wafer 200 may reduce the MV density thereof from a level of approximately $10^3$ to $10^9$ cm$^{-3}$ to a level of approximately zero to $10^3$ cm$^{-3}$. Hence, the MV density of wafer 200 after annealing will be less than that of boule 120 from which it was sliced.

Reducing the MV density of wafer 200 may also improve its optical transparency. In an embodiment, an optical absorption coefficient of wafer 200 is less than 1 cm$^{-1}$ at any wavelength within the range of approximately 210 nm to approximately 4,500 nm. In another embodiment, the optical absorption coefficient of wafer 200 is less than 5 cm$^{-1}$ at all wavelengths within the range of approximately 500 nm to approximately 3,000 nm. The optical absorption coefficient may be less than 1 cm$^{-1}$. Wafer 200 may have a diameter larger than approximately 2 cm.

Annealing wafer 200 may also result in a non-uniform distribution of MVs across wafer 200. Referring to FIG. 3, after annealing, a center region 300 may have a lower MV density than an edge region 320. For example, the MV density in center region 300 may be in the range of approximately zero to approximately $10^2$ cm$^{-3}$, and the MV density in edge region 320 may be in the range of approximately $10^3$ cm$^{-3}$ to approximately $10^4$ cm$^{-3}$. In an embodiment, boundary area 310 separates center region 300 from edge region 320. In an embodiment, center region 300 is approximately circular in shape and has a diameter of 1-3 mm, and edge region 320 conforms to an outer boundary of wafer 200 and has a width of approximately 3 mm to approximately 50 mm. Generally, the size of either center region 300 or edge region 320 may be larger than described above, with the other region correspondingly shrinking in size. The utilization of longer anneal times and/or higher annealing temperatures may result in the growth of center region 300 at the expense of edge region 320, i.e., boundary region 310 may effectively move toward the outer edge of wafer 200 as MVs are eliminated from wafer 200. In an embodiment, annealing proceeds for a time sufficient for boundary region 310 to reach the outer edge of wafer 200, i.e., substantially all of the area of wafer 200 will have a reduced density of MVs. In an embodiment, an overall MV density of wafer 200 may be within the range of approximately zero to approximately $10^2$ cm$^{-3}$.

Figure 4:
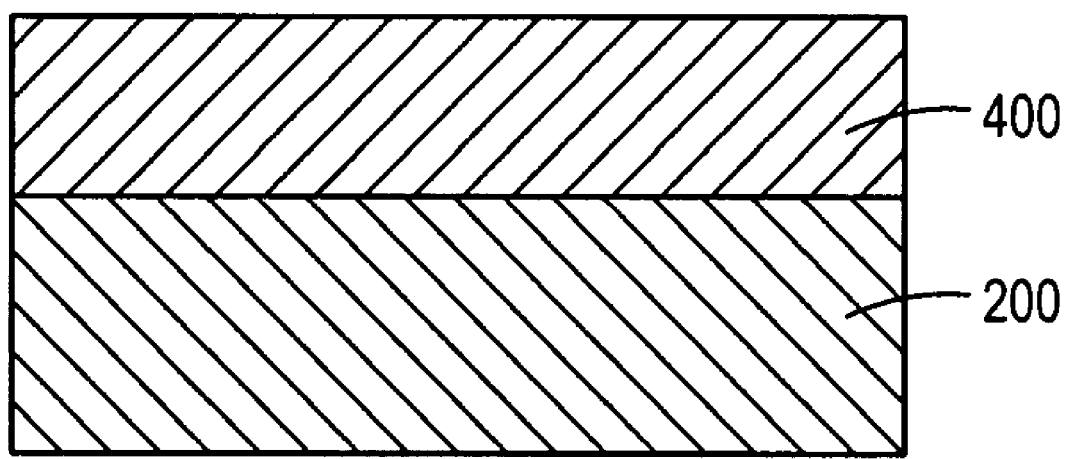
FIG. 4 schematically depicts an epitaxial layer deposited on an AlN wafer.

Referring to FIG. 4, epitaxial layer 400 may be deposited on a surface of wafer 200 for the purposes of subsequent device fabrication. Epitaxial layer 400 may include AlN, GaN, InN, and/or binary and tertiary alloys of each. Prior to epitaxial deposition, wafer 200 may be polished in order to improve the quality and planarity of a surface thereof. Various polishing techniques may be utilized, e.g., the methods described in U.S. patent application Ser. No. 11/448,595 and U.S. Pat. No. 7,037,838, the entire disclosures of which are hereby incorporated by reference. In an embodiment, wafer 200 is polished of chemical-mechanical polishing (CMP). Control of MV formation in wafer 200 may result in a superior post-polish surface of wafer 200, as few MVs will intersect the surface of wafer 200 and be etched preferentially during polishing. In an embodiment, after polishing, wafer 200 will have an etch pit density less than approximately 100 cm$^{-2}$. Control of MV formation during crystal growth and/or etch pit formation during polishing may facilitate the deposition of epitaxial layer 400 with a shallow pit density less than approximately 100 cm$^{-2}$. Wafer 200, with or without epitaxial layer 400, desirably is substantially crack-free.

It will be seen that the techniques described herein provide a basis for improved production of AlN crystals. The terms and expressions employed herein are used as terms of description and not of limitation, and there is no intention in the use of such terms and expressions of excluding any equivalents of the features shown and described or portions thereof. Instead, it is recognized that various modifications are possible within the scope of the invention claimed.

What is claimed is:

1. A method of growing single-crystal AlN, the method comprising the steps of:
   a. providing in a crystal growth enclosure a vapor comprising Al and $N_2$; and
   b. depositing the vapor as single-crystalline AlN having a microvoid density less than approximately $10^4$ cm$^{-3}$ while pushing the crystal growth enclosure at a rate less than an intrinsic growth rate of the AlN.

2. The method of claim 1, further comprising the step of maintaining, in the crystal growth enclosure, a partial pressure of $N_2$ greater than a stoichiometric pressure relative to the Al.

3. The method of claim 2, wherein the partial pressure of $N_2$ is within a range of 1-50 bar.

4. The method of claim 1, wherein the growth rate of the single-crystalline AlN in any crystallographic direction is within a range of approximately 0.1 to approximately 2 mm/hr.

5. The method of claim 1, wherein the push rate is at least 0.1 mm/hr.

6. The method of claim 1, wherein a concentration of oxygen in the vapor is less than 300 ppm and a concentration of hydrogen is less than 0.5%.

7. The method of claim 1, wherein the crystal growth enclosure comprises tungsten and a growth temperature is less than approximately 2350° C.

8. The method of claim 1, wherein the crystal growth enclosure comprises at least one of tantalum and carbon, and a growth temperature is less than approximately 2750° C.

9. The method of claim 1, further comprising maintaining a temperature gradient along a length of the crystal growth enclosure of greater than approximately 5° C./cm and less than approximately 100° C./cm.

10. The method of claim 1, further comprising, following deposition, the step of slicing a AlN wafer from the single-crystalline AlN.

11. The method of claim 10, wherein a cross-sectional area of the AlN wafer is approximately equal to a cross-sectional area of the single-crystalline AlN.

12. The method of claim 11, wherein the cross-sectional area of the AlN wafer is approximately circular with a diameter of greater than approximately 2 cm.

13. The method of claim 10, further comprising the step of annealing the AlN wafer at a first temperature and a first pressure.

14. The method of claim 13, further comprising the step of depositing an epitaxial layer on the AlN wafer after the AlN wafer is annealed.

15. The method of claim 1, further comprising:
   following deposition, slicing a AlN wafer from the single-crystalline AlN; and
   polishing the AlN wafer,
   wherein after polishing the AlN wafer has an etch pit density less than approximately 100 cm$^{-2}$.

16. The method of claim 15, further comprising the step of depositing an epitaxial layer on the AlN wafer, wherein the epitaxial layer has a surface pit density less than approximately 100 cm$^{-2}$.

17. The method of claim 1, wherein the microvoid density is greater than zero and the single-crystalline AlN is substantially crack-free.

18. A method of growing single-crystal AlN, the method comprising the steps of:
   a. providing in a crystal growth enclosure a vapor comprising Al and $N_2$; and
   b. depositing the vapor as single-crystalline AlN having a microvoid density less than approximately $10^4$ cm$^{-3}$,
   wherein the deposition of the single-crystalline AlN originates at a seed crystal disposed within the crystal growth enclosure and oriented such that a direction of maximum growth rate of the single-crystalline AlN is rotated at least approximately 10° away from a c-axis of the single-crystalline AlN and toward a non-polar direction.

19. A method of growing single-crystal AlN, the method comprising the steps of:
   a. providing in a crystal growth enclosure a vapor comprising Al and $N_2$;
   b. depositing the vapor as single-crystalline AlN having a microvoid density less than approximately $10^4$ cm$^{-3}$;
   c. following deposition, slicing a AlN wafer from the single-crystalline AlN; and
   d. annealing the AlN wafer at a first temperature and a first pressure,
   wherein the first temperature is greater than approximately 2000° C. and the first pressure is greater than approximately 35 bar.

20. The method of claim 19, wherein the first temperature is less than approximately 2350° C.

21. A method of growing single-crystal AlN, the method comprising the steps of:
   a. providing in a crystal growth enclosure a vapor comprising Al and $N_2$;
   b. depositing the vapor as single-crystalline AlN having a microvoid density less than approximately $10^4$ cm$^{-3}$;
   c. following deposition, slicing a AlN wafer from the single-crystalline AlN; and
   d. annealing the AlN wafer at a first temperature and a first pressure,
   wherein after annealing, a microvoid density in a center region of the AlN wafer is less than a microvoid density in an edge region of the AlN wafer.

22. The method of claim 21, wherein the microvoid density in a center region of the AlN wafer is less than approximately $10^4$ cm$^{-3}$.

23. The method of claim 22, wherein the microvoid density in a center region of the AlN wafer is approximately zero.

* * * * *